(12) United States Patent
Xiong et al.

(10) Patent No.: US 10,741,124 B2
(45) Date of Patent: Aug. 11, 2020

(54) PIXEL CIRCUIT, DISPLAY PANEL AND DISPLAY DEVICE

(71) Applicant: Shanghai Tianma AM-OLED Co., Ltd., Shanghai (CN)

(72) Inventors: Zhiyong Xiong, Shanghai (CN); Liyuan Liu, Shanghai (CN); Liujing Fan, Shanghai (CN)

(73) Assignee: SHANGHAI TIANMA AM-OLED CO., LTD., Shanghai (CN)

(*) Notice: Subject to any disclaimer, the term of this patent is extended or adjusted under 35 U.S.C. 154(b) by 0 days.

(21) Appl. No.: 16/360,197

(22) Filed: Mar. 21, 2019

(65) Prior Publication Data
US 2020/0168155 A1 May 28, 2020

(30) Foreign Application Priority Data

Nov. 27, 2018 (CN) .......................... 2018 1 1422764

(51) Int. Cl.
*G09G 3/3233* (2016.01)
*H01L 27/32* (2006.01)
(Continued)

(52) U.S. Cl.
CPC ......... *G09G 3/3233* (2013.01); *G09G 3/3258* (2013.01); *H01L 27/3248* (2013.01);
(Continued)

(58) Field of Classification Search
CPC ......... G09G 3/32; G09G 3/3225–3258; G09G 2320/0209; G09G 2320/0214; G09G 2320/0233; G09G 2320/0223; G09G 2300/08; G09G 2300/0809–0819; G09G 2310/0243–0259; H01L 27/3248; H01L 27/3265; H01L 27/3276; H01L 27/124;
(Continued)

(56) References Cited

U.S. PATENT DOCUMENTS

| | | | |
|---|---|---|---|
| 2012/0001893 A1* | 1/2012 | Jeong | G09G 3/3233 345/213 |
| 2012/0001896 A1* | 1/2012 | Han | G09G 3/3233 345/214 |

(Continued)

FOREIGN PATENT DOCUMENTS

| | | |
|---|---|---|
| CN | 1725273 A | 1/2006 |
| CN | 103903564 A | 7/2014 |
| CN | 107154239 A | 9/2017 |

OTHER PUBLICATIONS

Chinese Office Action dated Dec. 11, 2019 for corresponding CN Patent Application No. 201811422764.4.

*Primary Examiner* — David Tung
(74) *Attorney, Agent, or Firm* — Tarolli, Sundheim, Covell & Tummino LLP

(57) ABSTRACT

The present disclosure provides a pixel circuit, a display panel, and a display device. The pixel circuit includes: first and second scan signal input terminals; a data signal input terminal; a first power supply signal input terminal; a light-emitting control signal input terminal; a reference voltage input terminal; first to sixth transistors, a first capacitor, and a piezoresistor having a first electrode electrically connected to a first electrode plate of the first capacitor, and a second electrode electrically connected to a first electrode of the third transistor.

25 Claims, 12 Drawing Sheets

(51) Int. Cl.
*G09G 3/3258* (2016.01)
*H01L 27/12* (2006.01)

(52) U.S. Cl.
CPC ...... *H01L 27/3262* (2013.01); *H01L 27/3265* (2013.01); *H01L 27/3276* (2013.01); *G09G 2320/0209* (2013.01); *G09G 2320/0233* (2013.01); *H01L 27/124* (2013.01); *H01L 27/1222* (2013.01); *H01L 27/1225* (2013.01); *H01L 27/1251* (2013.01); *H01L 27/1255* (2013.01)

(58) Field of Classification Search
CPC ............ H01L 27/1222; H01L 27/1251; H01L 27/1255; H01L 27/1225
See application file for complete search history.

(56) References Cited

U.S. PATENT DOCUMENTS

| | | | |
|---|---|---|---|
| 2013/0002632 A1* | 1/2013 | Choi | G09G 3/325 |
| | | | 345/211 |
| 2013/0201172 A1* | 8/2013 | Jeong | G09G 3/325 |
| | | | 345/212 |
| 2014/0027719 A1* | 1/2014 | Kim | G09G 3/3241 |
| | | | 257/40 |
| 2015/0170576 A1* | 6/2015 | Bae | G09G 3/3266 |
| | | | 345/205 |
| 2015/0187270 A1* | 7/2015 | Lee | G09G 3/3258 |
| | | | 345/76 |
| 2017/0110048 A1* | 4/2017 | Kim | G09G 3/325 |
| 2017/0316740 A1* | 11/2017 | Yang | H01L 27/3248 |

* cited by examiner

US 10,741,124 B2

PIXEL CIRCUIT, DISPLAY PANEL AND DISPLAY DEVICE

CROSS-REFERENCE TO RELATED APPLICATIONS

The present application claims priority to Chinese Patent Application No. 201811422764.4, filed on Nov. 27, 2018, the content of which is incorporated herein by reference in its entirety.

TECHNICAL FIELD

The present disclosure relates to the field of display technologies, and in particular, to a pixel circuit, a display panel and a display device.

BACKGROUND

In the display technologies, an Organic Light Emitting Diode (OLED) display is commonly regarded in the industry as a third-generation display technology after Liquid Crystal Display (LCD) due to its advantages such as lightness and thinness, autonomous light-emitting, fast response, wide viewing angle, rich color, high brightness, low power consumption, high temperature resistance and the like.

The existing OLED display mainly performs light-emitting under control of current, and its light uniformity is controlled by a corresponding current. When an actual product adopts the optimized a pixel circuit in the related art, non-uniform display problems such as an OLED light-emitting element being not dark in a dark state and being not bright in a bright state still occur.

SUMMARY

The present disclosure provides a pixel circuit, a display panel and a display device, aiming to solve the non-uniform display problem and the screen crosstalk problem existing in the related art by providing a piezoresistor.

In an aspect, the present disclosure provides a pixel circuit, including: a first scan signal input terminal; a second scan signal input terminal; a data signal input terminal; a first power supply signal input terminal; a light-emitting control signal input terminal; a reference voltage input terminal; a first transistor, controlled by the light-emitting control signal input terminal and configured to transmit a first power supply signal from the first power supply signal input terminal; a second transistor, controlled by the second scan signal input terminal and configured to transmit a data signal from the data signal input terminal; a third transistor, configured to generate a driving current in accordance with the data signal transmitted by the second transistor; a fourth transistor, configured to detect and self-compensate for a threshold voltage deviation of the third transistor; a fifth transistor, controlled by the first scan signal input terminal, and connected to a reference voltage of the reference voltage input terminal; a sixth transistor, controlled by the light-emitting control signal input terminal, and transmitting the driving current generated by the third transistor; a first capacitor, configured to store the data signal transmitted to the third transistor; and a piezoresistor having a first electrode plate electrically connected to a first electrode of the first capacitor, and a second electrode electrically connected to a first electrode of the third transistor.

In another aspect, the present disclosure provides a display panel, including: a plurality of gate lines; a plurality of data lines; a plurality of reference voltage signal lines; a plurality of light-emitting signal control lines; a plurality of light-emitting elements, each including an anode, a light-emitting material, and a cathode; at least one first power supply signal line; at least one second power supply signal line; and a plurality of pixel circuits, each of the plurality of pixel circuits being the pixel circuit. The plurality of pixel circuits is arranged in N rows and M columns, and both N and M are positive integers greater than or equal to 2.

In still another aspect, the present disclosure provides a display device including the display panel described above.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

In order to clarify the purpose, technical solutions, and advantages of the embodiments of the present disclosure, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although a transistor, a power supply signal line, a metal layer and a semiconductor layer may be described using the terms of "first", "second", "third", etc. in the embodiments of the present disclosure, the transistor, the power supply signal line, the metal layer and the semiconductor layer will not be limited to these terms.

These terms are merely used to distinguish transistors, power supply signal lines, metal layers and semiconductor layers from one another. For example, without departing from the scope of the embodiments of the present disclosure, a first transistor, a first power supply signal line, a first metal layer, and a first semiconductor layer may also be referred to as a second transistor, a second power supply signal line, a second metal layer and a second semiconductor layer, respectively, and similarly, a second transistor, a second power supply signal line, a second metal layer, and a second semiconductor layer may also be referred to as a first transistor, a first power supply signal line, a first metal layer and a first semiconductor, respectively.

Figure 1:
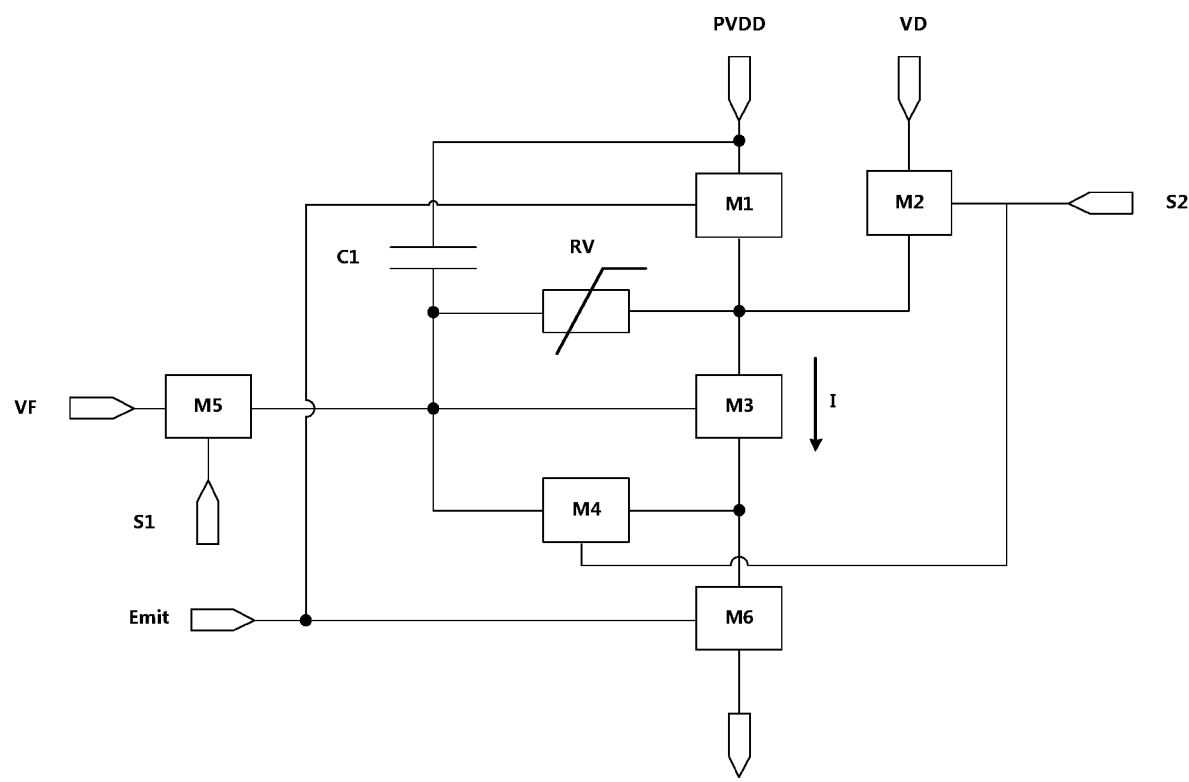
FIG. 1 is a circuit diagram of a pixel circuit according to an embodiment of the present disclosure.

An embodiment of the present disclosure provides a pixel circuit Pe. As shown in FIG. 1, the pixel circuit Pe includes a first scan signal input terminal S1, a second scan signal input terminal S2, a data signal input terminal VD, a first power supply signal input terminal PVDD, and a light-emitting control signal input terminal Emit, a reference voltage input terminal VF, a first transistor M1, a second transistor M2, a third transistor M3, a fourth transistor M4, a fifth transistor M5, a sixth transistor M6, a first capacitor C1, and a piezoresistor RV.

The first transistor M1 is controlled by the light-emitting control signal input terminal Emit, and is configured to transmit a first power supply signal V1 from the first power supply signal input terminal PVDD. The second transistor M2 is controlled by the second scan signal input terminal S2, and is configured to transmit a data signal Vdata from the data signal input terminal VD. The third transistor M3 is configured to generate a driving current I according to the data signal Vdata transmitted by the second transistor M2. The fourth transistor M4 is configured to detect and self-compensate a threshold voltage deviation of the third transistor M3. The fifth transistor M5 is controlled by the first scan signal input terminal S1, and is connected to a reference voltage Vvref of the reference voltage input terminal VF. The sixth transistor M6 is controlled by the light-emitting control signal input terminal Emit, and is configured to transmit the driving current I generated by the third transistor M3. The first capacitor C1 is configured to store the data signal Vdata transmitted to the third transistor M3.

With further reference to FIG. 1, the piezoresistor RV has a first electrode electrically connected to a first electrode plate of the first capacitor C1, and a second electrode electrically connected to a first electrode of the third transistor M3. The first electrode plate of the first capacitor C1 is electrically connected to a gate electrode of the third transistor M3, that is, the piezoresistor RV is electrically connected between the gate electrode of the third transistor M3 and the first electrode of the third transistor.

The pixel circuit Pe provided by this embodiment of the present disclosure is used to drive the third transistor (the transistor that generates the driving current I) and the sixth transistor (the transistor that provides a light-emitting current Ito a light-emitting element). In a circuit threshold detection phase, the data signal Vdata is written into the first electrode of the third transistor M3 until a Vgs of the third transistor M3 achieves a balance, at which a voltage at the first electrode of the third transistor M3 is equal to a difference between the data signal Vdata and a threshold voltage of the third transistor M3. Then, in a light-emitting phase, the third transistor M3 functions as a current source, and drives the light-emitting element to emit light through the sixth transistor M6.

It can be seen from the driving process of the pixel circuit Pe provided by this embodiment of the present disclosure that stability of a potential at the gate electrode of the third transistor M3 is related to the display effect. In the pixel circuit Pe provided by this embodiment of the present disclosure, the piezoresistor RV is arranged between the first electrode of the third transistor M3 and the first electrode plate of the first capacitor C1, so that the potential at the gate electrode of the third transistor M3 can be stabilized. On the one hand, when the voltage at the piezoresistor RV is lower than the threshold voltage of the piezoresistor RV, the current flowing through the piezoresistor RV is extremely small, and the piezoresistor RV is equivalent to a resistor having an infinitely-large resistance. That is, when the voltage applied on the piezoresistor RV is lower than the threshold voltage of the piezoresistor RV, the piezoresistor RV disconnects the first electrode of the third transistor M3 from the gate electrode of the third transistor M3, thereby avoiding current leakage. On the other hand, when the voltage applied on the piezoresistor RV exceeds the threshold voltage of the piezoresistor RV, the current flowing through the piezoresistor RV increases sharply, and the piezoresistor RV is equivalent to a resistor having an infinitely-small resistance. That is, when the voltage applied on the piezoresistor RV is higher than its threshold voltage, the piezoresistor RV is equivalent to a switch in a closed state. Thus, the piezoresistor RV can clamp the potential at the gate electrode of the third transistor M3 to a relatively fixed voltage value, thereby solving the non-uniform display problem.

Further, the threshold voltage of the piezoresistor RV may be equal to the threshold voltage of the third transistor M3.

Figure 2:
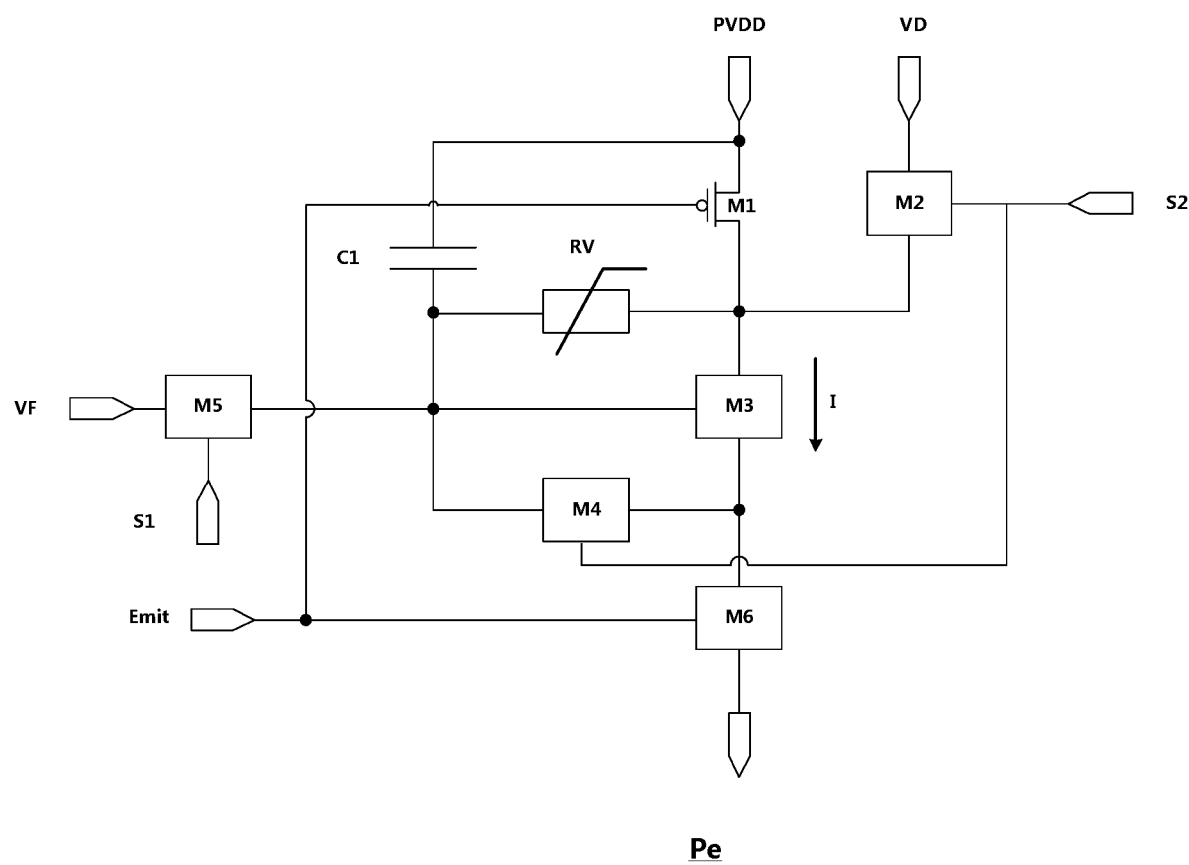
FIG. 2 is a circuit diagram of another pixel circuit according to an embodiment of the present disclosure.

An embodiment of the present disclosure further provides a pixel circuit Pe. As shown in FIG. 2, the first transistor M1 can be a triode. The first transistor M1 has a gate electrode electrically connected to the light-emitting control signal input terminal Emit, a first electrode electrically connected to the first power supply signal input terminal PVDD, and a second electrode electrically connected to the first electrode of the third transistor M3.

Figure 3:
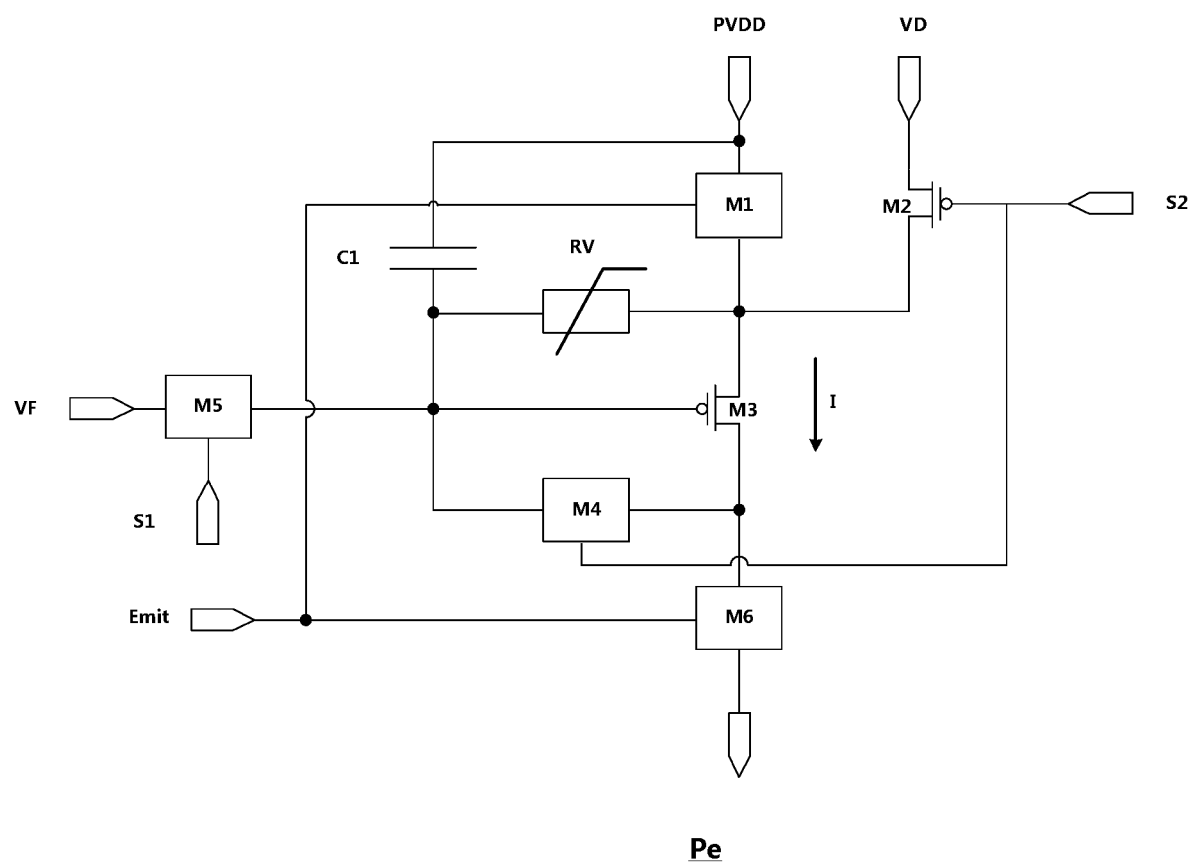
FIG. 3 is a circuit diagram of still another pixel circuit according to an embodiment of the present disclosure.

An embodiment of the present disclosure further provides a pixel circuit Pe, as shown in FIG. 3. The second transistor M2 can be a triode. The second transistor M2 has a gate electrode electrically connected to the second scan signal input terminal S2, a first electrode electrically connected to the data signal input terminal VD, and a second electrode electrically connected to the first electrode of the third transistor M3.

Figure 6:
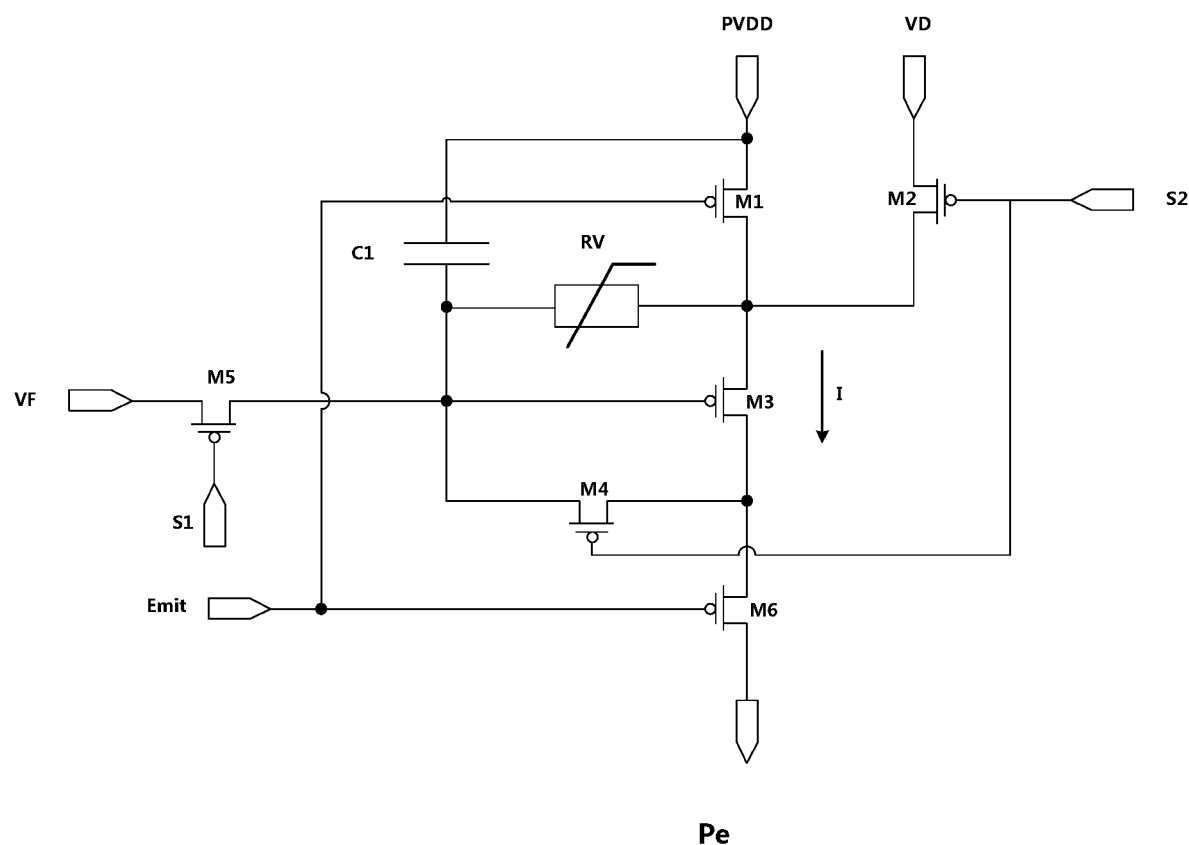
FIG. 6 is a circuit diagram of yet another pixel circuit according to an embodiment of the present disclosure.

An embodiment of the present disclosure further provides a pixel circuit Pe. As shown in FIG. 6, both the third transistor M3 and the sixth transistor M6 are triodes. The third transistor M3 has a gate electrode electrically connected to the first electrode plate of the first capacitor C1, and a second electrode electrically connected to a first electrode of the sixth transistor M6. The first capacitor C1 has a second electrode plate electrically connected to the first power supply signal input terminal PVDD.

Figure 4:
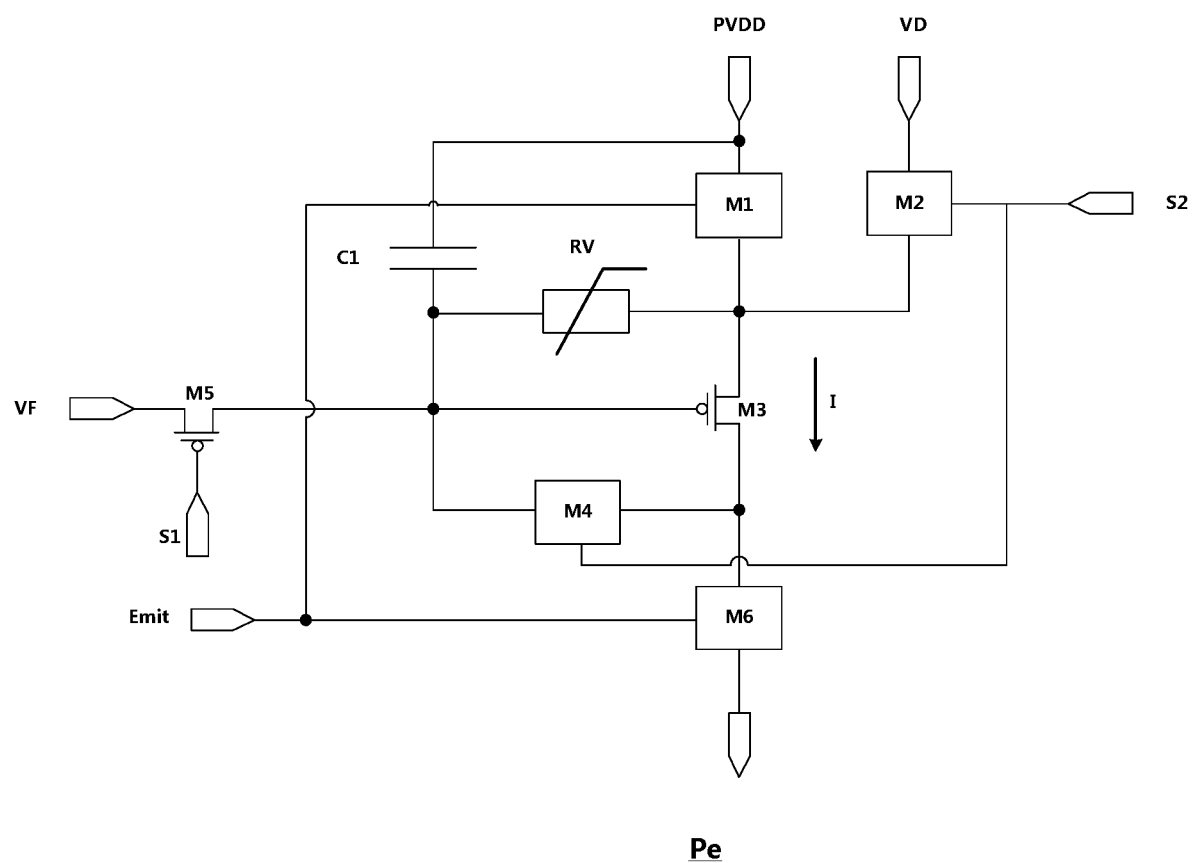
FIG. 4 is a circuit diagram of yet another pixel circuit according to an embodiment of the present disclosure.

An embodiment of the present disclosure further provides a pixel circuit Pe. As shown in FIG. 4 and FIG. 6, the fifth transistor M5 is a triode. The fifth transistor M5 has a gate electrode electrically connected to the first scan signal input terminal S1, a first electrode electrically connected to the reference voltage input terminal VF, and a second electrode electrically connected to the gate electrode of the third transistor M3.

Figure 5:
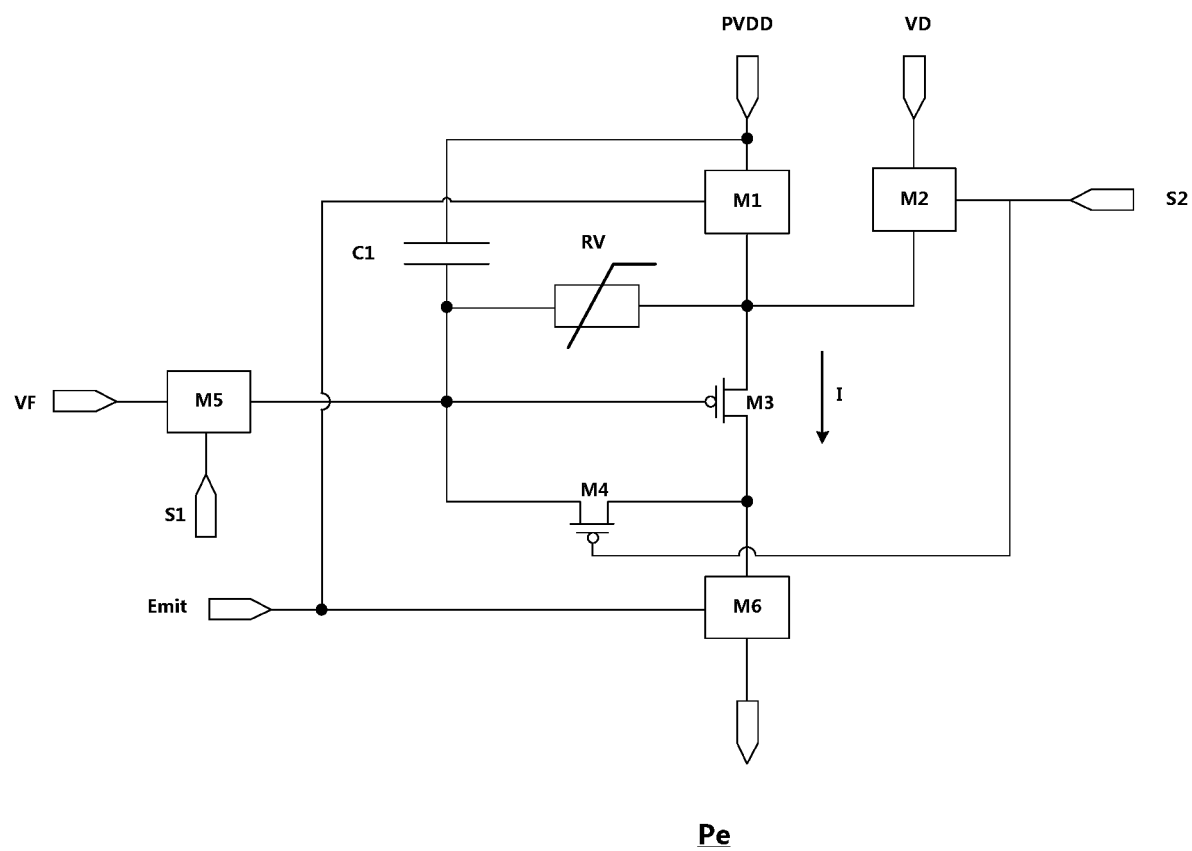
FIG. 5 is a circuit diagram of yet another pixel circuit according to an embodiment of the present disclosure.

An embodiment of the present disclosure further provides a pixel circuit Pe. As shown in FIG. 5 and FIG. 6, the fourth transistor M4 is a triode. The fourth transistor M4 has a gate electrode electrically connected to the second scan signal input terminal S2, a first electrode electrically connected to the gate electrode of the third transistor M3, and a second electrode electrically connected to the second electrode of the third transistor M3.

It should be noted that the first transistor M1, all of the second transistor M2, the third transistor M3, the fourth transistor M4, the fifth transistor M5, and the sixth transistor M6 shown in FIG. 6 may be P-type transistors, which is only an exemplary implementation manner of the present disclosure. In other embodiments of the present disclosure, the first transistor M1, all of the second transistor M2, the third transistor M3, the fourth transistor M4, the fifth transistor M5, and the sixth transistor M6 may be N-type transistors.

When the first transistor M1, the second transistor M2, the third transistor M3, the fourth transistor M4, the fifth transistor M5, and the sixth transistor M6 are all P-type transistors, the reference voltage Vvref is a low potential signal. When the first transistor M1, the second transistor M2, the third transistor M3, the fourth transistor M4, the fifth transistor M5, and the sixth transistor M6 are all N-type transistors, the reference voltage Vvref is a high potential signal.

In the pixel circuit Pe provided by this embodiment of the present disclosure, the first transistor M1, the second transistor M2, the third transistor M3, the fourth transistor M4, the fifth transistor M5, and the sixth transistor M6 is of a same type, so that the process for manufacturing the first transistor M1, the second transistor M2, the third transistor M3, the fourth transistor M4, the fifth transistor M5, and the sixth transistor M6 can be simplified, thereby improving the manufacturing efficiency.

Figure 7:
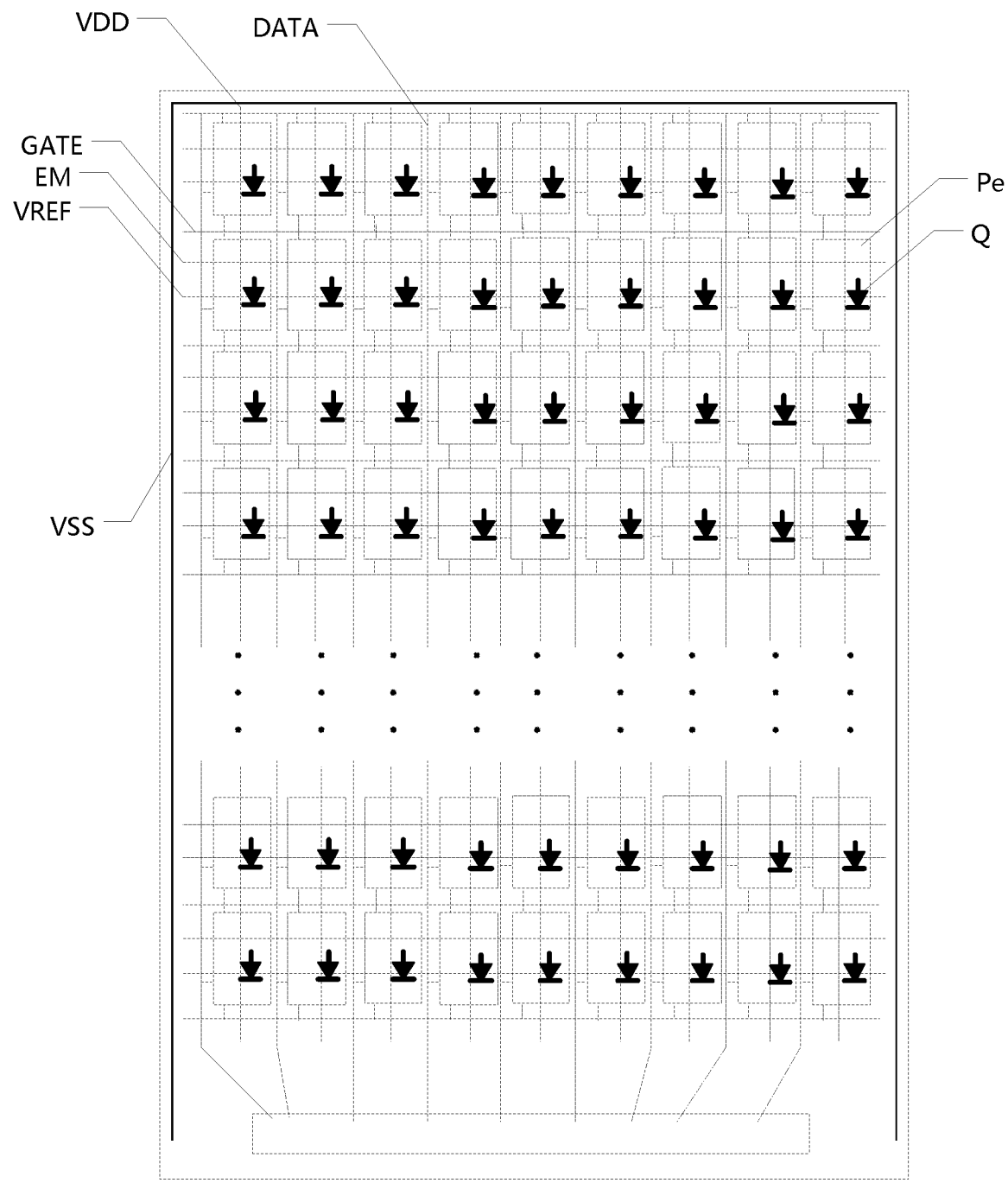
FIG. 7 is a top view of a display panel according to an embodiment of the present disclosure.

An embodiment of the present disclosure further provides a display panel 100. As shown in FIG. 7, the display panel 100 includes a plurality of gate lines GATE, a plurality of data lines DATA, a plurality of reference voltage signal lines VREF, a plurality of light-emitting signal control lines EM, a plurality of light-emitting elements Q, at least one first power supply signal line VDD, at least one second power supply signal line VSS, and a plurality of pixel circuits Pe.

Figure 10:
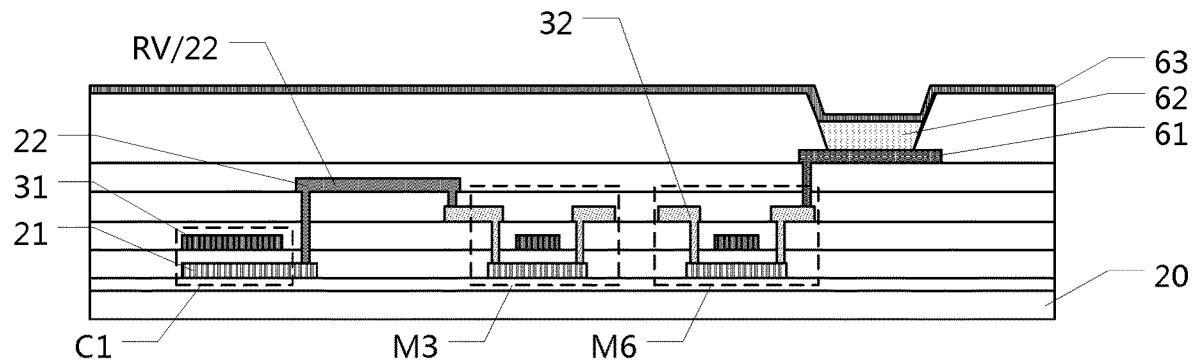
FIG. 10 is a schematic diagram illustrating a layered structure of a display panel according to an embodiment of the present disclosure.

As shown in FIG. 7 and FIG. 10, the light-emitting element Q further includes an anode 61, a light-emitting material 62, and a cathode 63. The light-emitting material 62 is located between the anode 61 and the cathode 63.

The plurality of pixel circuit Pe can be any type of the pixel circuits shown in FIG. 1 to FIG. 6. The plurality of pixel circuit Pe is arranged in N rows and M columns, and both N and M are positive integers larger than or equal to 2.

For the display panel 100 provided by this embodiment of the present disclosure, the piezoresistor RV is arranged in the pixel circuit Pe. Thus, in a light-emitting phase of the pixel circuit Pe, the first electrode of the third transistor M3 can be controlled at a high voltage and may not be influenced at a low voltage. In this way, the voltage at the first electrode of the third transistor M3 can be stabilized. As a result, the non-uniform display problems in the related art such as an OLED light-emitting element being not dark in a dark state and being not bright in a bright state can be solved, thereby improving the display effect.

Figure 8:
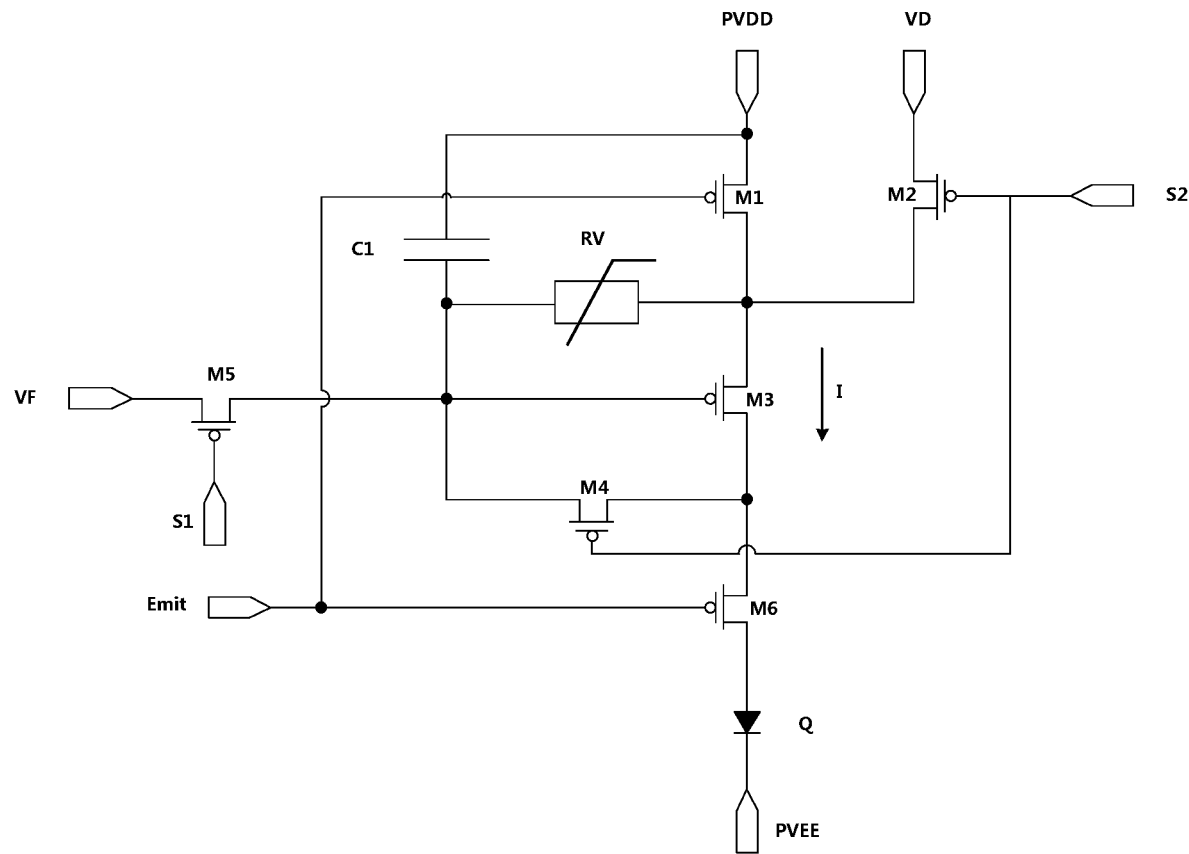
FIG. 8 is a diagram illustrating a connection relation between a pixel circuit and a light-emitting element of a display panel according to an embodiment of the present disclosure.

Further, with reference to FIG. 7 and FIG. 8, for the display panel 100 provided by this embodiment of the present disclosure, the second electrode of the sixth transistor M6 in the pixel circuit Pe is electrically connected to the light-emitting element Q. The cathode of the light-emitting element Q is electrically connected to the second power supply signal input terminal PVEE. As shown in FIG. 10, the second electrode of the sixth transistor M6 is electrically connected to the anode 61 of the light-emitting element.

Further, with reference to FIG. 7 and FIG. 8, the first power supply signal input terminal PVDD in the pixel circuit Pe is electrically connected to the first power supply signal line VDD, and the second power supply signal input terminal PVEE in the pixel circuit Pe is electrically connected to the second power supply signal line VSS. The reference voltage input terminal VF of the pixel circuit Pe is electrically connected to the reference voltage signal line VREF.

Further, with reference to FIG. 7 and FIG. 8, the first scan signal input terminal S1 of a pixel circuit Pe arranged in an $n^{th}$ row is electrically connected to a scan line GATE of the $n^{th}$ row, where $2 \leq n \leq N$ and n is an integer. The second scan signal input terminal S2 of the pixel circuit Pe arranged in the $n^{th}$ row is electrically connected to a scan line GATE of a $(n-1)^{th}$ row. The light-emitting control signal input terminal Emit of the pixel circuit Pe arranged in the $n^{th}$ row is electrically connected to the light-emitting control signal line EM of the $n^{th}$ row.

The second scan signal input terminal of the pixel circuit arranged in the $n^{th}$ row is electrically connected to the scan line of the $(n-1)^{th}$ row.

The light-emitting control signal input terminal of the pixel circuit arranged in the $n^{th}$ row is electrically connected to the light-emitting control signal line of the $n^{th}$ row.

Further, with reference to FIG. 7 and FIG. 8, the data signal input terminal VD of the pixel circuit Pe arranged in an $m^{th}$ column is electrically connected to the data line DATA of the $m^{th}$ column, where $2 \leq m \leq M$ and m is an integer.

Figure 9:
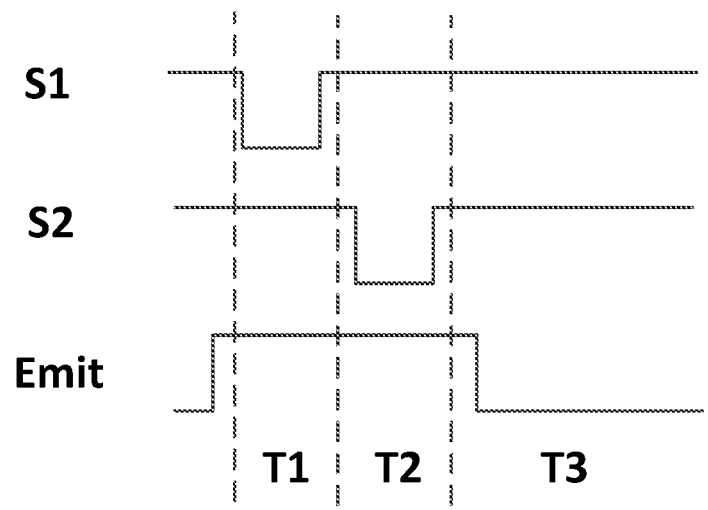
FIG. 9 is a sequence chart of a pixel circuit of a display panel according to an embodiment of the present disclosure.

For one pixel circuit Pe, signals from the first scan signal input terminal S1, the second scan signal input terminal S2, and the light-emitting control signal input terminal Emit are as shown in FIG. 9.

With reference to FIG. 8 and FIG. 9, a phase T1 is a gate reset phase. In the phase T1, the reference voltage input terminal VF is connected to the reference voltage Vvref, and the reference voltage Vvref is connected to the gate electrode of the third transistor M3. Taking the third transistor M3 as a P-type transistor by way of an example, the reference voltage Vvref is at a low level that is smaller than −2V, and thus the piezoresistor RV is in an off state in this phase.

With further reference to FIG. 8 and FIG. 9, a phase T2 is a threshold detection phase. The data signal input terminal VD is connected to the data signal Vdata, and the data signal Vdata is connected to the first electrode of the third transistor M3 until the Vgs of the third transistor M3 achieves a balance, at which a potential at the gate electrode of the third transistor M3 is equal to a difference between the data signal Vdata and the threshold voltage of the third transistor M3. Since the potential at the gate electrode of the third transistor M3 is increased gradually from the low level to the difference between the data signal Vdata and the threshold voltage of the third transistor M3, the piezoresistor RV is still in an off state in this phase.

With reference to FIG. 8 and FIG. 9, a phase T3 is a light-emitting phase. The third transistor M3 is switched on, and the current I is driven to the sixth transistor M6. When the potential at the gate electrode of the third transistor M3 is too high due to the peripheral current leakage, the piezoresistor RV is turned on for voltage division, so as to maintain the potential at the gate electrode of the third transistor M3.

In the above three phases, the light-emitting phase takes up the main part of time. In the light-emitting phase, the piezoresistor RV functions as voltage limiting, thereby limiting the current output from the pixel circuit Pe to the light-emitting element, thereby solving the non-uniform display problem.

For the display panel 100 provided by this embodiment of the present disclosure, the pixel circuits Pe are arranged in a matrix with N rows and M columns, and match up with the matrix arrangement of m rows of the gate lines GATE and m rows of the data lines DATA, the reference voltage signal line VREF, the light-emitting signal control line EM, the first power supply signal line VDD and the second power supply signal line VSS,. In this way, the display effect of each pixel point of the display panel 100 can be optimized, thereby solving the non-uniform display problem and thus improving the display effect of the display panel 100.

Embodiments of the present disclosure also provide layered structures of various display panels 100 and various manners of arranging the piezoresistor RV.

An embodiment of the present disclosure provides a display panel 100. As shown in FIG. 10, the display panel 100 includes a first semiconductor layer 21, a first metal layer 31, and a second metal layer 32. The gate electrodes of the sixth transistor M6 and the third transistor M3 and the gate line are located in the first metal layer 31. The first electrode of the sixth transistor M6, the second electrode of the sixth transistor M6, and the data line are located in the second metal layer 32. The first electrode plate of the first capacitor C1 and a semiconductor portion of the sixth transistor M6 are located in the first semiconductor layer 21. That is, the first electrode plate of the first capacitor C1 is formed in the first semiconductor layer 21. The second electrode plate of the first capacitor C1 is located in the first metal layer 31.

With reference to FIG. 10, the display panel 100 further includes a second semiconductor layer 22. The second semiconductor layer 22 is located between the second metal layer 32 and the anode 61, that is, the second semiconductor layer 22 is located between the layer where the data line is located and the layer where the anode 61 is located. The third transistor M3 has a semiconductor portion located in the first semiconductor layer 21, and the piezoresistor RV has a semiconductor portion located in the second semiconductor layer 22. That is, the semiconductor portion of the third transistor M3 and the semiconductor portion of the piezoresistor RV are located in different layers.

Further, the first semiconductor layer 21 is made of a low temperature poly-silicon. The second semiconductor layer 22 is a made of a metal oxide, such as an II-VI group oxide semiconductor (such as zinc oxide ZnO), and the second semiconductor layer 22 includes a divalent element zinc (Zn) and a hexavalent elemental oxygen (O).

Figure 11:
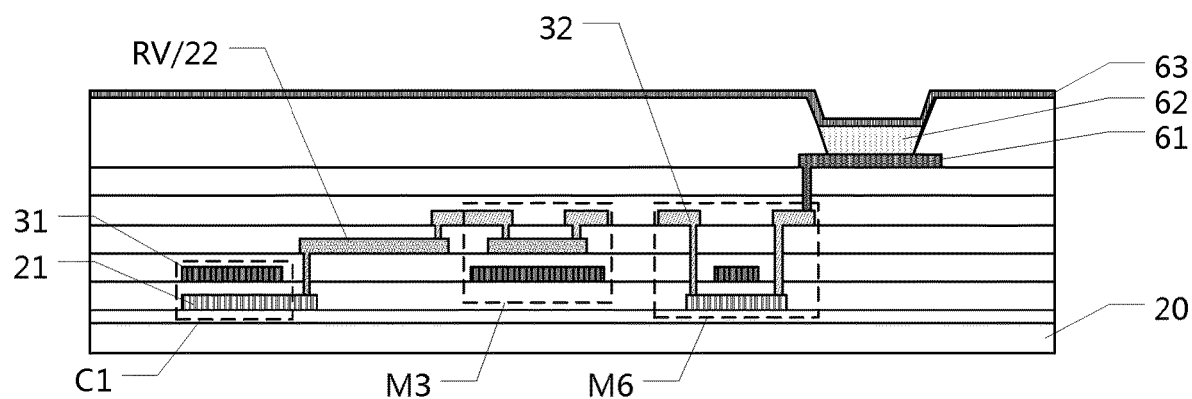
FIG. 11 is a schematic diagram illustrating a layered structure of another display panel according to an embodiment of the present disclosure.

In other embodiments of the present disclosure, the semiconductor portion of the piezoresistor RV may also be arranged at other positions. As shown in FIG. 11, the display panel 100 further includes a second semiconductor layer 22, and the second semiconductor layer 22 is located between the first metal layer 31 and the second metal layer 32. The semiconductor portion of the third transistor M3 and the semiconductor portion of the piezoresistor RV are located in the second semiconductor layer 22, that is, the semiconductor portion of the third transistor M3 and the semiconductor portion of the piezoresistor RV are located in a same layer.

The second semiconductor layer 22 includes indium zinc oxide (IZO), and may also include $In_2O_3$, $Ga_2O_3$, or ZnO.

Figure 12:
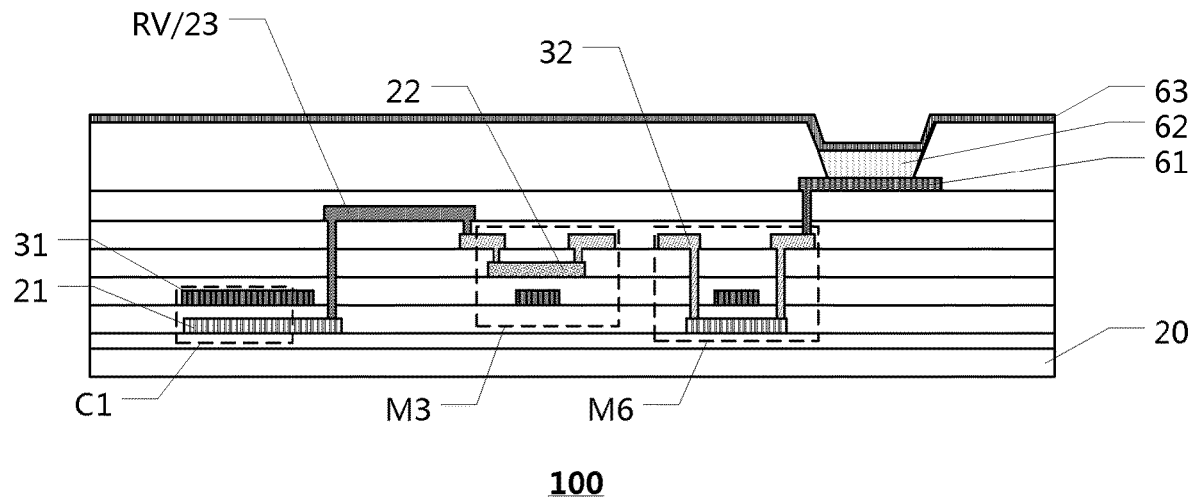
FIG. 12 is a schematic diagram illustrating a layered structure of still another display panel according to an embodiment of the present disclosure.

An embodiment of the present disclosure further provides a display panel 100. As shown in FIG. 12, the display panel 100 further includes a second semiconductor layer 22 and a third semiconductor layer 23. The second semiconductor layer 22 is located between the first metal layer 31 and the second metal layer 32. The third semiconductor layer 23 is located between the second metal layer 32 and the anode 61. The semiconductor portion of the third transistor M3 is located in the second semiconductor layer 22, and the semiconductor portion of the piezoresistor RV is located in the third semiconductor layer 23.

Further, the second semiconductor layer 22 includes indium zinc oxide, and may also include $In_2O_3$, $Ga_2O_3$, or ZnO. The third semiconductor layer 23 is a metal oxide. The third semiconductor layer 23 and the second semiconductor layer 22 are made of different materials.

For the display panel 100 provided by this embodiment of the present disclosure, various feasible solutions are provided for arranging the piezoresistor RV in different layers of the display panel 100 on the premise of arranging the first electrode plate of the first capacitor C1 in the first semiconductor layer 21. In combination with the existing manufacturing process of the display panel, the piezoresistor RV is arranged in the pixel circuit, so that the non-uniform display problem can be solved.

Figure 13:
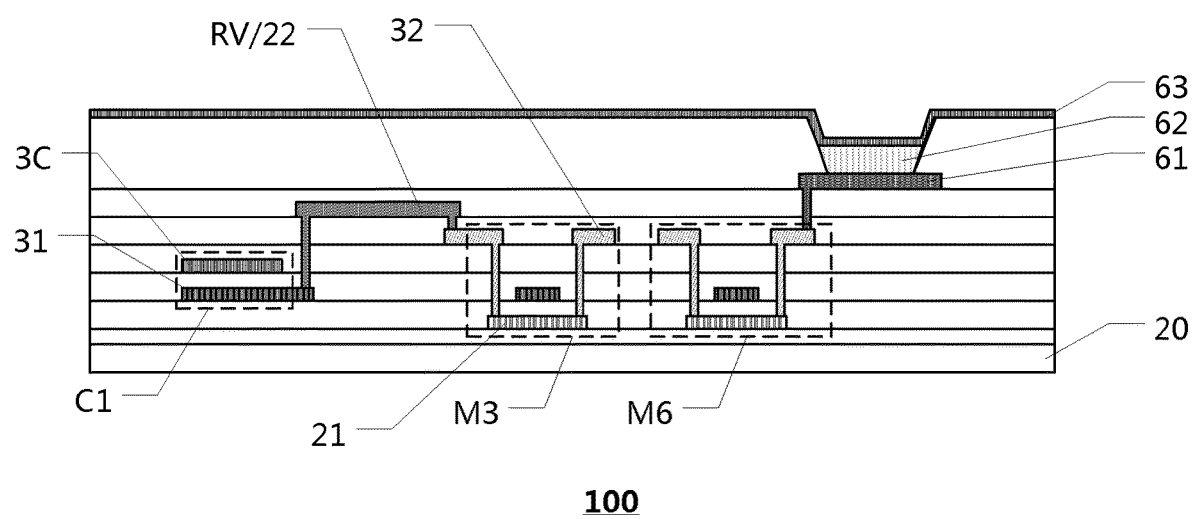
FIG. 13 is a schematic diagram illustrating a layered structure of yet another display panel according to an embodiment of the present disclosure.

An embodiment of the present disclosure further provides a display panel 100. As shown in FIG. 13, the display panel 100 includes a first semiconductor layer 21, a first metal layer 31, a capacitor metal layer 3C, and a second metal layer 32. The gate electrode of the sixth transistor M6, the gate electrode of the third transistor M3, and the gate line are located in the first metal layer 31. The first electrode of the sixth transistor M6, the second electrode of the sixth transistor M6, and the data line are located in the second metal layer 32. The semiconductor portion of the sixth transistor M6 is located in the first semiconductor layer 21. The first electrode plate of the first capacitor C1 is located in the first metal layer 31, and the second electrode plate of the first capacitor C1 is located in the capacitor metal layer 3C.

With further reference to FIG. 13, the display panel 100 further includes a second semiconductor layer 22. The second semiconductor layer 22 is located between the second metal layer 32 and the anode 61. The semiconductor portion of the third transistor M3 is located in the first semiconductor layer 21, and the semiconductor portion of the piezoresistor RV is located in the second semiconductor layer 22.

Further, the first semiconductor layer 21 is made of a low temperature poly-silicon. The second semiconductor layer 22 is made of a metal oxide, such as an II-VI group oxide semiconductor (such as zinc oxide ZnO), and the second semiconductor layer 22 includes a divalent element zinc (Zn) and a hexavalent elemental oxygen (O).

Figure 14:
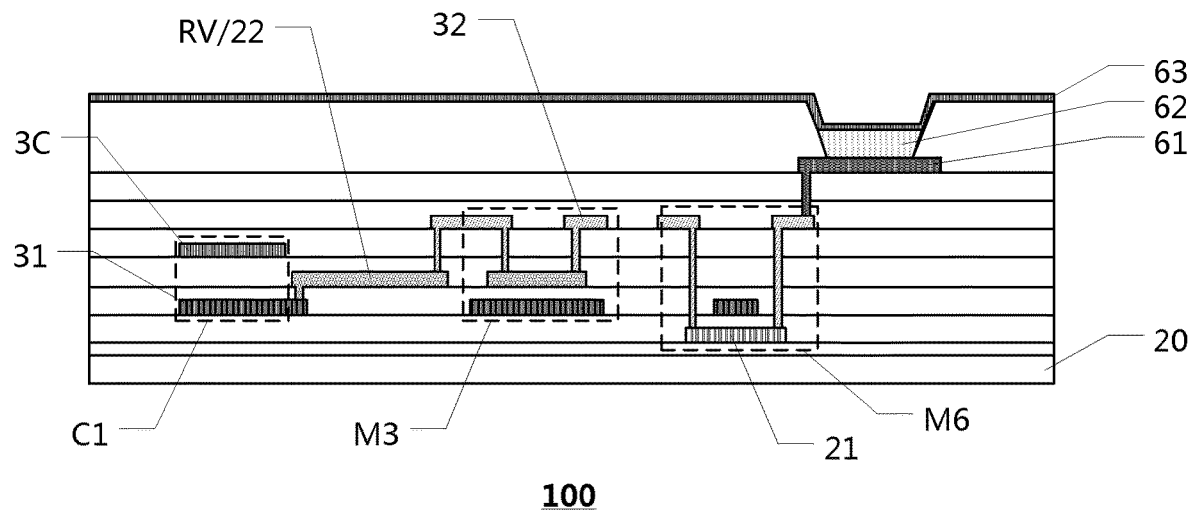
FIG. 14 is a schematic diagram illustrating a layered structure of yet another display panel according to an embodiment of the present disclosure.

In other embodiments of the present disclosure, the semiconductor portion of the piezoresistor RV may also be arranged at other positions. As shown in FIG. 14, the display panel 100 further includes a second semiconductor layer 22, and the second semiconductor layer 22 is located between the first metal layer 31 and the second metal layer 32. The semiconductor portion of the third transistor M3 and the semiconductor portion of the piezoresistor RV are located in the second semiconductor layer 22, that is, the semiconductor portion of the third transistor M3 and the semiconductor portion of the piezoresistor RV are located in a same layer and adopt a same material. The second semiconductor layer 22 includes indium zinc oxide (IZO), and may also include $In_2O_3$, $Ga_2O_3$, or ZnO.

Figure 15:
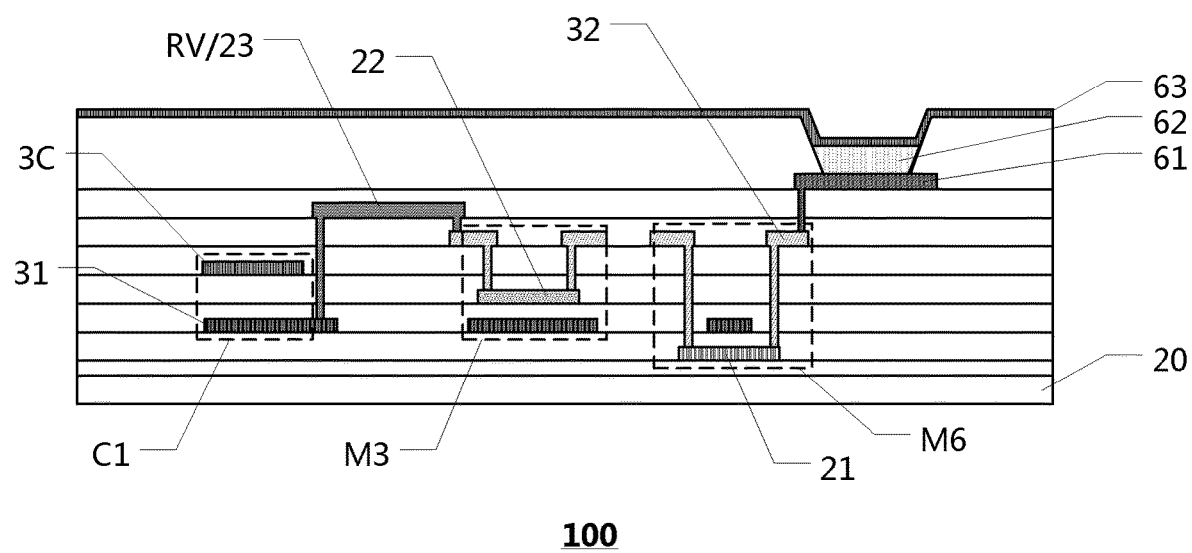
FIG. 15 is a schematic diagram illustrating a layered structure of yet another display panel according to an embodiment of the present disclosure.

An embodiment of the present disclosure further provides a display panel 100. As shown in FIG. 15, the display panel 100 further includes a second semiconductor layer 22 and a third semiconductor layer 23. The second semiconductor layer 22 is located between the first metal layer 31 and the second metal layer 32. The third semiconductor layer 23 is located between the second metal layer 32 and the anode 61. The semiconductor portion of the third transistor M3 is located in the second semiconductor layer 22, and the semiconductor portion of the piezoresistor RV is located in the third semiconductor layer 23.

Further, the second semiconductor layer 22 includes indium zinc oxide (IZO), and may also include $In_2O_3$, $Ga_2O_3$, or ZnO. The third semiconductor layer 23 is a metal oxide.

The third semiconductor layer 23 and the second semiconductor layer 22 may be made different materials.

For the display panel 100 provided by this embodiment of the present disclosure, various feasible solutions are provided for arranging the piezoresistor RV in different layers of the display panel 100 on the premise of arranging the first electrode plate of the first capacitor C1 in the capacitor metal layer 3C. In combination with the existing manufacturing process of the display panel, the piezoresistor RV is arranged in the pixel circuit, so that the non-uniform display problem can be solved.

Figure 16:
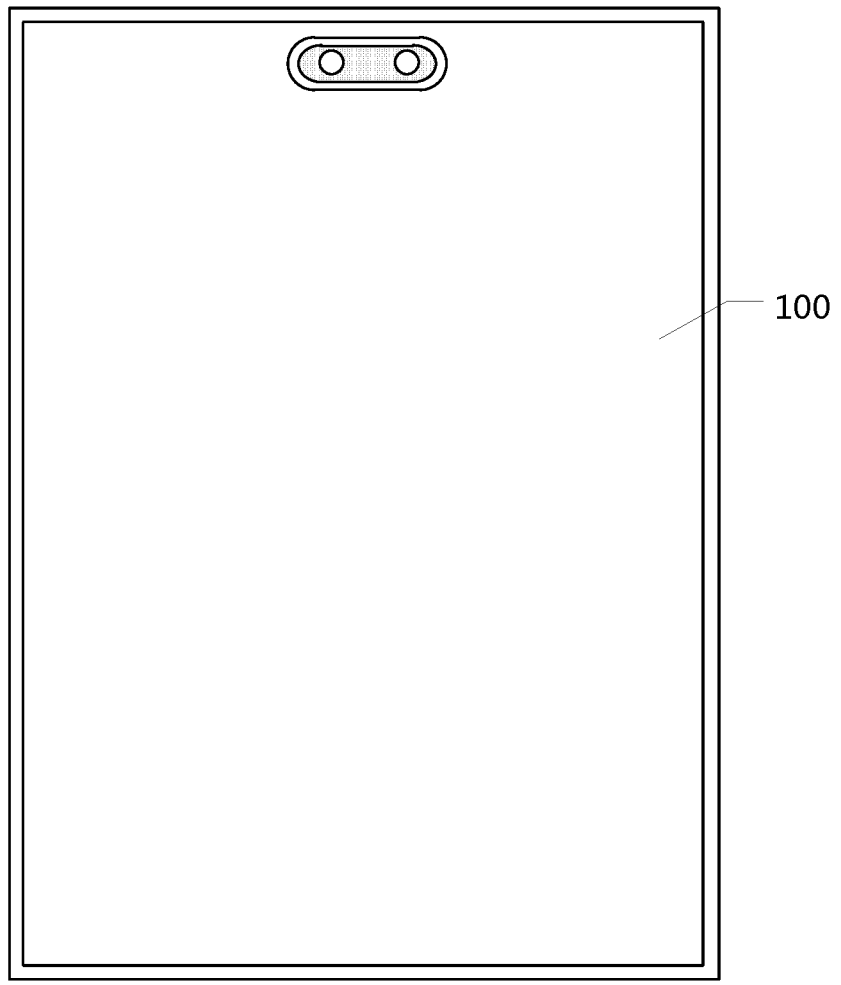
FIG. 16 is a top view of a display device according to an embodiment of the present disclosure.

An embodiment of the present disclosure further provides a display device 500. As shown in FIG. 16, the display device 500 includes the display panel 100 provided by the embodiments of the present disclosure.

It should be noted that FIG. 16 merely shows one shape of the display device 500. In other embodiments of the present disclosure, the display device 500 may also have other shapes, such as a circular shape, an elliptical shape, a non-rectangular shape, etc. The non-display area of the display device 500 can be provided with a notch, a digging, a water drop, and the like.

For the display device 500 provided by this embodiment of the present disclosure, the piezoresistor RV is arranged in the pixel circuit Pe. Thus, in a light-emitting phase of the pixel circuit Pe, the first electrode of the third transistor M3 can be controlled at a high voltage and may not be influenced at a low voltage. In this way, the voltage of the first electrode of the third transistor M3 can be stabilized. As a result, the non-uniform display problems in the related art such as a display panel being not dark in a dark state and being not bright in a bright state can be solved, thereby improving the display effect.

The device embodiments described above are merely illustrative, the units illustrated as separate components may or may not be physically separated, and the components shown as units may or may not be physical units, i.e., they may be located in one place, or may be distributed to at least two network units. Some or all of the modules may be selected according to actual needs to achieve the purpose of the solution of the embodiment. Those skilled in the art can understand and implement without paying creative efforts.

Finally, it should be noted that the above-described embodiments are merely for illustrating the present disclosure but not intended to provide any limitation. Although the present disclosure has been described in detail with reference to the above-described embodiments, it should be understood by those skilled in the art that it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A pixel circuit, comprising:
   a first scan signal input terminal;
   a second scan signal input terminal;
   a data signal input terminal;
   a first power supply signal input terminal;
   a light-emitting control signal input terminal,
   a reference voltage input terminal;
   a first transistor controlled by the light-emitting control signal input terminal and configured to transmit a first power supply signal from the first power supply signal input terminal;
   a second transistor controlled by the second scan signal input terminal and configured to transmit a data signal from the data signal input terminal;
   a third transistor configured to generate a driving current in accordance with the data signal transmitted by the second transistor;
   a fourth transistor configured to detect and self-compensate for a threshold voltage deviation of the third transistor;
   a fifth transistor controlled by the first scan signal input terminal and connected to a reference voltage of the reference voltage input terminal;
   a sixth transistor controlled by the light-emitting control signal input terminal and configured to transmit the driving current generated by the third transistor;
   a first capacitor configured to store the data signal transmitted by the second transistor; and
   a piezoresistor having a first electrode electrically connected to a first electrode plate of the first capacitor and a second electrode electrically connected to a first electrode of the third transistor.

2. The pixel circuit according to claim 1, wherein the piezoresistor and the third transistor have a common threshold voltage.

3. The pixel circuit according to claim 1, wherein the first transistor has a gate electrode electrically connected to the light-emitting control signal input terminal, a first electrode electrically connected to the first power supply signal input terminal, and a second electrode electrically connected to the first electrode of the third transistor.

4. The pixel circuit according to claim 1, wherein the second transistor comprises a gate electrode electrically connected to the second scan signal input terminal, a first electrode electrically connected to the data signal input terminal, and a second electrode electrically connected to the first electrode of the third transistor.

5. The pixel circuit according to claim 4, wherein the third transistor further comprises a gate electrode electrically connected to the first electrode plate of the first capacitor, and a second electrode electrically connected to a first electrode of the sixth transistor; and the first capacitor has a second electrode plate electrically connected to the first power supply signal input terminal.

6. The pixel circuit according to claim 1, wherein the fifth transistor has a gate electrode electrically connected to the first scan signal input terminal, a first electrode electrically connected to the reference voltage input terminal, and a second electrode electrically connected to a gate electrode of the third transistor.

7. The pixel circuit according to claim 1, wherein the fourth transistor has a gate electrode electrically connected to the second scan signal input terminal, a first electrode electrically connected to a gate electrode of the third transistor, and a second electrode electrically connected to a second electrode of the third transistor.

8. The pixel circuit according to claim 1, wherein the first through sixth transistors are all P-type transistors or are all N-type transistors.

9. The pixel circuit according to claim 8, wherein the reference voltage is a low potential signal when the first through sixth transistors are all P-type transistors; and the reference voltage is a high potential signal when the first through sixth transistors are all N-type transistors.

10. A display panel, comprising:
a plurality of gate lines;
a plurality of data lines;
a plurality of reference voltage signal lines;
a plurality of light-emitting signal control lines;
a plurality of light-emitting elements, each comprising an anode, a light-emitting material, and a cathode;
at least one first power supply signal line;
at least one second power supply signal line; and
a plurality of pixel circuits, each of the plurality of pixel circuits being the pixel circuit according to claim 1, wherein the plurality of pixel circuits is arranged in N rows and M columns, and both N and M are positive integers greater than or equal to 2.

11. The display panel according to claim 10, wherein the cathode of each of the plurality of light-emitting elements is electrically connected to a second electrode of the sixth transistor of one of the plurality of pixel circuits, and the cathode of the light-emitting element is electrically connected to a second power supply signal input terminal.

12. The display panel according to claim 10, wherein the first power supply signal input terminal of one of the plurality of pixel circuits is electrically connected to a respective first power supply signal line of the at least one first power supply signal line, and a second power supply signal input terminal of one of the plurality of pixel circuits is electrically connected to a respective second power supply signal line of the at least one second power supply signal line; and the reference voltage input terminal of one of the plurality of pixel circuits is electrically connected to a respective reference voltage signal line of the plurality of reference voltage signal lines.

13. The display panel according to claim 12, wherein the first scan signal input terminal of each pixel circuit arranged in an $n^{th}$ row is electrically connected to a scan line arranged in the $n^{th}$ row, where $2 \leq n \leq N$ and n is an integer;

the second scan signal input terminal of each pixel circuit arranged in the $n^{th}$ row is electrically connected to a scan line arranged in a $(n-1)^{th}$ row; and the light-emitting control signal input terminal of each pixel circuit arranged in the $n^{th}$ row is electrically connected to the light-emitting signal control line arranged in the $n^{th}$ row.

14. The display panel according to claim 12, wherein the data signal input terminal of each pixel circuit arranged in an $m^{th}$ column is electrically connected to the data line arranged in the $m^{th}$ column, where $2 \leq m \leq M$ and m is an integer.

15. The display panel according to claim 10, wherein the display panel has a first semiconductor layer, a first metal layer, and a second metal layer;

wherein a gate electrode of the sixth transistor of each of the plurality of pixel circuits and the plurality of gate lines are located in the first metal layer;

first and second electrodes of the sixth transistor of each of the plurality of pixel circuits and the plurality of data lines are located in the second metal layer; and the first electrode plate of the first capacitor and a semiconductor portion of the sixth transistor of each of the plurality of pixel circuits are located in the first semiconductor layer.

16. The display panel according to claim 15, wherein the display panel further has a second semiconductor layer located between the second metal layer and the anode of each of the plurality of light-emitting elements;

a semiconductor portion of the third transistor of each of the plurality of pixel circuits is located in the first semiconductor layer; and a semiconductor portion of the piezoresistor of each of the plurality of pixel circuits is located in the second semiconductor layer.

17. The display panel according to claim 16, wherein the first semiconductor layer is made of a low temperature poly-silicon and the second semiconductor layer is made of a metal oxide.

18. The display panel according to claim 15, wherein the display panel further has a second semiconductor layer located between the first metal layer and the second metal layer;

a semiconductor portion of the third transistor and a semiconductor portion of the piezoresistor of each of the plurality of pixel circuits are located in the second semiconductor layer; and the second semiconductor layer comprises indium zinc oxide.

19. The display panel according to claim 15, wherein the display panel further has a second semiconductor layer and a third semiconductor layer, the second semiconductor layer is located between the first metal layer and the second metal layer, and the third semiconductor layer is located between the second metal layer and the anode of each of the plurality of light-emitting elements;

a semiconductor portion of the third transistor of each of the plurality of pixel circuits is located in the second semiconductor layer;

a semiconductor portion of the piezoresistor of each of the plurality of pixel circuits is located in the third semiconductor layer; and the second semiconductor layer comprises indium zinc oxide, the third semiconductor layer is made of a metal oxide, and the third semiconductor layer and the second semiconductor layer are made of different materials.

20. The display panel according to claim 10, wherein the display panel has a first semiconductor layer, a first metal layer, a capacitor metal layer, and a second metal layer;
- a gate electrode of the sixth transistor of each of the plurality of pixel circuits and the plurality of gate lines are located in the first metal layer;
- first and second electrodes of the sixth transistor of each of the plurality of pixel circuits and the plurality of data lines are located in the second metal layer;
- a semiconductor portion of the sixth transistor of each of the plurality of pixel circuits is located in the first semiconductor layer; and
- the first electrode plate of the first capacitor of each of the plurality of pixel circuits is located in the first metal layer, and a second electrode plate of the first capacitor of each of the plurality of pixel circuits is located in the capacitor metal layer.

21. The display panel according to claim 20, wherein the display panel further has a second semiconductor layer located between the second metal layer and the anode of each of the plurality of light-emitting elements;
- a semiconductor portion of the third transistor of each of the plurality of pixel circuits is located in the first semiconductor layer; and
- a semiconductor portion of the piezoresistor of each of the plurality of pixel circuits is located in the second semiconductor layer.

22. The display panel according to claim 21, wherein the first semiconductor layer is made of a low temperature poly-silicon, and the second semiconductor layer is made of a metal oxide.

23. The display panel according to claim 20, wherein the display panel further has a second semiconductor layer located between the first metal layer and the second metal layer;
- a semiconductor portion of the third transistor and a semiconductor portion of the piezoresistor of each of the plurality of pixel circuits are located in the second semiconductor layer; and
- the second semiconductor layer comprises indium zinc oxide.

24. The display panel according to claim 20, wherein the display panel further has a second semiconductor layer and a third semiconductor layer, the second semiconductor layer is located between the first metal layer and the second metal layer, and the third semiconductor layer is located between the second metal layer and the anode of each of the plurality of light-emitting elements;
- a semiconductor portion of the third transistor of each of the plurality of pixel circuits is located in the second semiconductor layer;
- a semiconductor portion of the piezoresistor of each of the plurality of pixel circuits is located in the third semiconductor layer, and
- the second semiconductor layer comprises indium zinc oxide, the third semiconductor layer is made of a metal oxide, and the third semiconductor layer and the second semiconductor layer are made of different materials.

25. A display device, comprising the display panel according to claim 10.

* * * * *